United States Patent
Chong et al.

(10) Patent No.: US 10,490,470 B2
(45) Date of Patent: Nov. 26, 2019

(54) SEMICONDUCTOR PACKAGE AND METHOD FOR FABRICATING A SEMICONDUCTOR PACKAGE

(71) Applicant: Infineon Technologies AG, Neubiberg (DE)

(72) Inventors: Hock Heng Chong, Melaka (MY); Sook Woon Chan, Melaka (MY); Chau Fatt Chiang, Melaka (MY); Khar Foong Chung, Perak (MY); Chee Hong Fang, Ipoh (MY); Muhammat Sanusi Muhammad, Melaka (MY); Mei Chin Ng, Melaka (MY); Yean Seng Ng, Melaka (MY); Pei Luan Pok, Melaka (MY); Choon Huey Wang, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/838,417

(22) Filed: Dec. 12, 2017

(65) Prior Publication Data

US 2018/0174935 A1 Jun. 21, 2018

(30) Foreign Application Priority Data

Dec. 13, 2016 (DE) .......................... 10 2016 124 270

(51) Int. Cl.
  *H01L 23/28* (2006.01)
  *H01L 23/00* (2006.01)
  (Continued)

(52) U.S. Cl.
  CPC .......... *H01L 23/28* (2013.01); *H01L 21/4846* (2013.01); *H01L 21/6836* (2013.01);
  (Continued)

(58) Field of Classification Search
  CPC ....... H01L 33/54; H01L 33/52; H01L 33/483; H01L 33/48; H01L 31/1892;
  (Continued)

(56) References Cited

U.S. PATENT DOCUMENTS 4,826,272 A * 5/1989 Pimpinella ........... G02B 6/4202
  257/432
5,359,222 A * 10/1994 Okutomo ............ H01L 23/3107
  257/659

(Continued)

FOREIGN PATENT DOCUMENTS

DE 10127009 A1 12/2002
DE 10325029 A1 1/2005
  (Continued)

OTHER PUBLICATIONS

Definition of the term "paste", Dictionary.com, https://www.dictionary.com/browse/paste, date accessed Dec. 22, 2018 (Year: 2018).*
  (Continued)

*Primary Examiner* — Earl N Taylor

(57) ABSTRACT

A method of fabricating a semiconductor package comprises providing a carrier, fabricating an opening in the carrier, attaching a semiconductor chip to the carrier and fabricating an encapsulation body covering the semiconductor chip.

11 Claims, 5 Drawing Sheets

(51) Int. Cl.
*H01L 23/31* (2006.01)
*H01L 31/0203* (2014.01)
*H01L 21/48* (2006.01)
*H01L 33/64* (2010.01)
*H01L 21/683* (2006.01)
*H01L 23/13* (2006.01)
*H01L 33/54* (2010.01)
*H01L 23/498* (2006.01)

(52) U.S. Cl.
CPC .......... *H01L 23/13* (2013.01); *H01L 23/3107* (2013.01); *H01L 23/562* (2013.01); *H01L 24/16* (2013.01); *H01L 24/96* (2013.01); *H01L 31/0203* (2013.01); *H01L 33/642* (2013.01); *H01L 23/49827* (2013.01); *H01L 24/06* (2013.01); *H01L 24/13* (2013.01); *H01L 24/48* (2013.01); *H01L 24/81* (2013.01); *H01L 33/54* (2013.01); *H01L 2221/68304* (2013.01); *H01L 2224/06181* (2013.01); *H01L 2224/13147* (2013.01); *H01L 2224/16227* (2013.01); *H01L 2224/16235* (2013.01); *H01L 2224/48227* (2013.01); *H01L 2224/73204* (2013.01); *H01L 2924/181* (2013.01); *H01L 2933/005* (2013.01); *H01L 2933/0033* (2013.01)

(58) Field of Classification Search
CPC ......... H01L 31/0203; H01L 2933/0033; H01L 2924/3512; H01L 2924/3511; H01L 2924/351; H01L 2924/35; H01L 2924/157151; H01L 2924/15153; H01L 2924/15151; H01L 24/96; H01L 23/562; H01L 23/28; H01L 21/6836; H01L 21/6835; H01L 21/683; H01L 21/68; H01L 21/302
See application file for complete search history.

(56) References Cited

U.S. PATENT DOCUMENTS

| | | | | |
|---|---|---|---|---|
| 5,424,573 | A * | 6/1995 | Kato | G02B 6/4249 257/116 |
| 5,670,797 | A * | 9/1997 | Okazaki | H01L 24/97 257/100 |
| 6,048,755 | A * | 4/2000 | Jiang | H01L 23/3107 257/E23.124 |
| 6,100,595 | A * | 8/2000 | Jaouen | G02B 6/4212 257/100 |
| 6,155,119 | A | 12/2000 | Normann | B60C 23/04 73/756 |
| 6,338,985 | B1 * | 1/2002 | Greenwood | H01L 21/561 257/723 |
| 6,441,503 | B1 * | 8/2002 | Webster | G01L 19/0645 257/417 |
| 6,623,178 | B1 * | 9/2003 | Sakurai | G02B 6/4201 385/88 |
| 6,661,084 | B1 * | 12/2003 | Peterson | H01L 25/105 257/680 |
| 6,674,159 | B1 * | 1/2004 | Peterson | B81B 7/0067 257/431 |
| 6,713,864 | B1 * | 3/2004 | Huang | H01L 23/4334 257/692 |
| 6,765,236 | B2 * | 7/2004 | Sakurai | H01L 27/14618 257/432 |
| 6,982,491 | B1 * | 1/2006 | Fan | B81B 7/0077 257/370 |
| 6,987,312 | B2 * | 1/2006 | Theuss | B81B 7/0077 257/680 |
| 7,015,579 | B2 * | 3/2006 | Okada | G06K 9/0002 257/433 |
| 7,304,362 | B2 * | 12/2007 | Zhou | H01L 21/565 257/432 |
| 7,505,276 | B2 * | 3/2009 | Dangelmaier | H01L 23/055 361/735 |
| 7,629,660 | B2 * | 12/2009 | Bauer | H01L 23/3135 250/216 |
| 7,675,180 | B1 * | 3/2010 | St. Amand | B81C 1/0023 257/777 |
| 7,732,915 | B2 * | 6/2010 | Dangelmaier | B81B 7/0058 257/704 |
| 7,781,852 | B1 * | 8/2010 | Faheem | G01L 19/0636 257/419 |
| 7,898,043 | B2 * | 3/2011 | Ziglioli | B81B 7/0061 257/414 |
| 8,138,027 | B2 * | 3/2012 | Camacho | H01L 21/563 257/E21.502 |
| 8,536,709 | B1 * | 9/2013 | Hsu | H01L 22/14 257/764 |
| 8,604,567 | B2 * | 12/2013 | Solf | B81B 7/0016 257/414 |
| 8,680,636 | B2 * | 3/2014 | Yajima | H01L 23/26 257/431 |
| 8,866,237 | B2 * | 10/2014 | Manack | B81C 1/00246 257/414 |
| 8,895,440 | B2 * | 11/2014 | Choi | H01L 21/561 438/113 |
| 8,900,931 | B2 * | 12/2014 | Liang | B81B 7/0077 257/737 |
| 9,263,315 | B2 * | 2/2016 | Oda | H01L 23/49503 |
| 9,653,323 | B2 * | 5/2017 | Chew | H05K 1/0373 |
| 9,794,661 | B2 * | 10/2017 | Watson | H04R 1/023 |
| 9,966,517 | B2 * | 5/2018 | Oda | H01L 21/6835 |
| 2001/0048064 | A1 * | 12/2001 | Kitani | H01L 27/14618 250/208.1 |
| 2002/0175621 | A1 * | 11/2002 | Song | H01L 33/641 313/515 |
| 2003/0080341 | A1 * | 5/2003 | Sakano | B29C 67/08 257/79 |
| 2004/0175866 | A1 * | 9/2004 | Woerz | H01L 21/565 438/127 |
| 2005/0285247 | A1 * | 12/2005 | Reiss | H01L 23/13 257/678 |
| 2006/0273420 | A1 * | 12/2006 | Bauer | H01L 23/3135 257/432 |
| 2008/0164543 | A1 * | 7/2008 | Ziglioli | B81B 7/0061 257/415 |
| 2009/0296414 | A1 * | 12/2009 | Moriyama | F21S 8/026 362/373 |
| 2010/0073620 | A1 * | 3/2010 | Yamaguchi | G02F 1/133305 349/160 |
| 2010/0127296 | A1 * | 5/2010 | Hioki | H01L 25/167 257/98 |
| 2011/0096515 | A1 * | 4/2011 | Uchida | B81C 1/00261 361/748 |
| 2011/0278638 | A1 * | 11/2011 | Lin | H01L 21/486 257/99 |
| 2012/0138967 | A1 * | 6/2012 | Shimizu | H01L 25/167 257/88 |
| 2012/0313131 | A1 * | 12/2012 | Oda | H01L 23/49503 257/98 |
| 2013/0077295 | A1 * | 3/2013 | Hayashi | F21V 29/00 362/217.05 |
| 2013/0161809 | A1 * | 6/2013 | Chew | H05K 1/0373 257/734 |
| 2014/0061878 | A1 * | 3/2014 | Mahler | H01L 24/96 257/666 |
| 2016/0049344 | A1 * | 2/2016 | Andry | H01L 21/82 257/618 |
| 2016/0056080 | A1 * | 2/2016 | Takahashi | H01L 21/78 438/462 |
| 2016/0099395 | A1 * | 4/2016 | Oda | H01L 23/49503 257/98 |
| 2016/0218263 | A1 * | 7/2016 | Ling | H01L 33/62 |
| 2016/0261941 | A1 * | 9/2016 | Brioschi | B81B 7/0058 |
| 2017/0033009 | A1 * | 2/2017 | Scanlan | H01L 24/20 |
| 2018/0174935 | A1 * | 6/2018 | Chong | H01L 23/3107 |

(56) References Cited

U.S. PATENT DOCUMENTS

FOREIGN PATENT DOCUMENTS

| | | |
|---|---|---|
| DE | 102004029765 A1 | 3/2006 |
| DE | 102005025754 A1 | 12/2006 |

OTHER PUBLICATIONS

Definition of the term "paste", Merriam-Webster, https://www.merriam-webster.com/dictionary/paste, date accessed Dec. 22, 2018 (Year: 2018).*

Definition of the term "glue", Merriam-Webster, https://www.merriam-webster.com/dictionary/glue#other-words, date accessed Dec. 22, 2018 (Year: 2018).*

Definition of the term "silicone", Britannica Online Encyclopedia, https://www.britannica.com/print/article/544410, date accessed Dec. 22, 2018 (Year: 2018).*

Definition of the term "silicone", Merriam-Webster, https://www.merriam-webster.com/dictionary/silicone, date accessed Dec. 22, 2018 (Year: 2018).*

\* cited by examiner

SEMICONDUCTOR PACKAGE AND METHOD FOR FABRICATING A SEMICONDUCTOR PACKAGE

TECHNICAL FIELD

This disclosure relates to a semiconductor package, in particular to a semiconductor package comprising a carrier with an opening and to a method for fabricating such a semiconductor package.

BACKGROUND

Semiconductor packages may comprise a carrier and a semiconductor chip attached to the carrier. The semiconductor chip and the carrier may exhibit different coefficients of thermal expansion (CTEs) which may induce stress in the semiconductor package, for example during the fabrication process of the semiconductor package or during operation. In the worst case the stress may even lead to delamination of components and to device failure. Furthermore, certain applications, for example optoelectronic applications, may require structuring the carrier in order to provide an optical passage to the semiconductor chip.

SUMMARY

There may be a need for improved structuring concepts in order to provide stress relief, improved optoelectronic packages and more flexible packaging methods.

Various aspects pertain to a method of fabricating a semiconductor package, the method comprising: providing a carrier; fabricating an opening in the carrier; attaching a semiconductor chip to the carrier; and fabricating an encapsulation body covering the semiconductor chip.

Various aspects pertain to a semiconductor package, comprising: a carrier comprising an opening; a semiconductor chip attached to the carrier; and an encapsulation body covering the semiconductor chip, wherein the opening is configured to relieve the semiconductor package from stress.

Various aspects pertain to an optoelectronic semiconductor package, comprising: a carrier comprising an opening; a semiconductor chip comprising a photo active area and attached to the carrier, wherein the photo active area faces the opening; an optically transparent paste arranged in the opening; and an encapsulation body covering the semiconductor chip, wherein the optically transparent paste comprises a material that is different from the encapsulation body.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

Figure 1A:
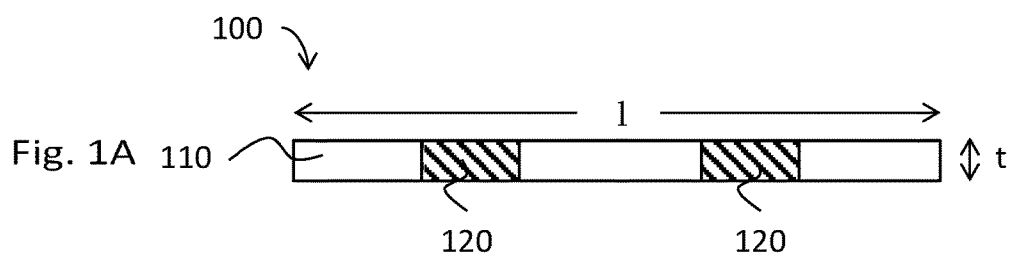
FIGS. 1A-1G are schematic side views of various stages of fabrication of semiconductor packages comprising a carrier with an opening according to the disclosure.

In the following detailed description, reference is made to the accompanying drawings, in which is shown by way of illustration specific examples in which the disclosure may be practiced. It may be evident, however, to one skilled in the art that one or more aspects of the examples may be practiced with a lesser degree of the specific details. In other instances, known structures and elements are shown in schematic form in order to facilitate describing one or more aspects of the examples. In this regard, directional terminology, such as "top", "bottom", "left", "right", "upper", "lower" etc., is used with reference to the orientation of the Figure(s) being described.

Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements. Also, the term "exemplary" is merely meant as an example, rather than the best or optimal. The following detailed description, therefore, is not to be taken in a limiting sense.

The semiconductor chip(s) described further below may be of different types, may be manufactured by different technologies and may include for example integrated electrical, electro-optical or electro-mechanical circuits and/or passives, logic integrated circuits, control circuits, microprocessors, memory devices, etc.

The semiconductor chip(s) can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor chip(s) considered herein may be thin. In order to allow handling or manipulation of the semiconductor chip, e.g. handling/manipulation required for packaging, eWLP (embedded Wafer Level Packaging), or semiconductor device assembly, the semiconductor chip may form part of a composite chip. A composite chip may comprise the semiconductor chip and a reinforcing chip secured to the semiconductor chip. The reinforcing chip adds stability and/or strength to the composite chip to make it manageable.

The semiconductor chip(s) may have contact pads (or electrodes) which allow electrical contact to be made with the integrated circuits included in the semiconductor chip(s). The electrodes may be arranged all at only one main face(s) of the semiconductor chip(s) or at both main faces of the semiconductor chip(s). They may include one or more electrode metal layers which are applied to the semiconductor material of the semiconductor chip(s). The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

The semiconductor chip(s) may be bonded to a carrier, for example a pre-mold frame. The carrier may be a (permanent) device carrier used for packaging. The carrier may comprise or consist of any sort of material as, for example, ceramic or metallic material, copper or copper alloy or iron/nickel alloy and any appropriate plastic or polymer material such as, e.g., a duroplastic, thermoplastic or thermosetting material, a mold material, a laminate, and may e.g. contain filler materials. The carrier can be connected mechanically and electrically with one contact element of the semiconductor chip(s). In particular, conductive elements of the carrier may be electrically coupled to chip electrodes.

Bonding the semiconductor chip(s) to the carrier may e.g. be done by soldering, gluing, or sintering. In case the semiconductor chip(s) are attached by soldering, a soft solder material or, in particular, a solder material capable of forming diffusion solder bonds may be used, for example a solder material comprising one or more metal materials selected from the group of Sn, SnAg, SnAu, SnCu, In, InAg, InCu and InAu.

The semiconductor chip(s) may be covered with an encapsulation body after being bonded to the carrier (substrate). The encapsulation body may be electrically insulating. The encapsulation body may comprise or be made of any appropriate plastic or polymer material such as, e.g., a duroplastic, thermoplastic or thermosetting material, and may e.g. contain filler materials. The encapsulation body may comprise the same material(s) as the carrier. Various techniques may be employed to encapsulate the semiconductor chip(s) with the encapsulation body, for example compression molding, injection molding, powder molding, liquid molding or lamination. Heat and/or pressure may be used to apply the encapsulation body.

FIG. 1A shows an example of a carrier or pre-mold frame 100 comprising at least one first element 110 and at least one second element 120. The first element 110 may be an insulating part of the carrier 100 and may for example comprise or consist of a plastic material, a thermoset plastic, a polymer, a mold material, an epoxy mold compound and a laminate. The second element 120 may be an electrically conductive element of the carrier 100 and may for example comprise or consist of a suitable metal like Cu, Fe, Ni, Au, Ag or an alloy of one or more of these metals. The second element 120 may be configured to form a contact pad for an electrode of a semiconductor chip attached to the carrier 100 as described further below. The second element 120 may be part of a redistribution structure.

The carrier 100 may be configured to be part of a semiconductor package, for example an optoelectronic semiconductor package and may have any suitable dimensions. For example, the carrier 100 may have a length l up to 1 mm, 2 mm, 3 mm, 4 mm, 5 mm, 1 cm or more than 1 cm. The carrier 100 may have a thickness t up to 50 µm (micrometer), 100 µm (micrometer), 300 µm (micrometer), 600 µm (micrometer), 1 mm or more than 1 mm.

Figure 1B:
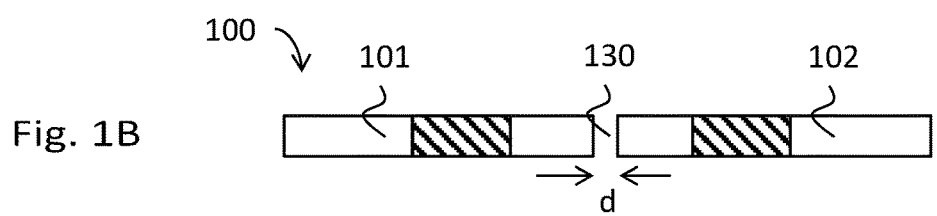

FIG. 1B shows a carrier 100 comprising an opening 130. The opening 130 may be arranged in the first element 110 of the carrier 100 as shown in FIG. 1B or in the second element 120 or partly in the first element 110 and partly in the second element 120. According to an example, the opening 130 may be a hole. According to another example, the opening 130 may be a trench. The trench may completely separate the carrier 100, for example into a first segment 101 (left of the trench) and a second segment 102 (right of the trench). The first and second segments 101, 102 may be physically separated by the opening 130 and they may be electrically separated by the opening 130. According to an example, the carrier 100 may comprise multiple openings 130, wherein the multiple openings 130 may be arranged in any suitable pattern. The multiple openings may all be of the same type (e.g. only holes or only trenches) or they may be of different or mixed types (e.g. both holes and trenches).

According to an example, the opening 130 may be fabricated by cutting through the carrier 100 or by drilling through the carrier 100. For example, a laser may be used for the cutting or drilling process. The process step of fabricating the opening 130 may be part of a process of fabricating a semiconductor package and may be performed prior to an encapsulation step.

The opening 130 may have any suitable diameter d, for example up to 10 µm (micrometer), 50 µm (micrometer), 100 µm (micrometer), 500 µm, 1 mm or more than 1 mm. The opening 130 may extend through the whole thickness t of the carrier 100 as shown in FIG. 1B.

Figure 1C:
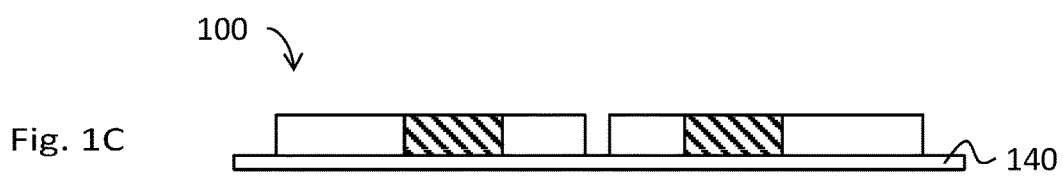

FIG. 1C shows an example according to the disclosure, wherein the carrier 100 is arranged on a temporary carrier 140. The temporary carrier 140 may be a tape, for example an adhesive tape to which the carrier 100 may adhere. The carrier 100 may be arranged on the temporary carrier 140 during a fabrication process of a semiconductor package comprising the carrier 100. In the case that the opening 130 separates the carrier 100 into a first segment 101 and a second segment 102, the temporary carrier 140 may be configured to keep the first and second segments 101, 102 in a defined position relative to each other. According to an example, the carrier 100 is arranged on (attached to) the temporary carrier 140 before the opening 130 is fabricated.

Figure 1D:

FIG. 1D shows another example according to the disclosure, wherein a paste 150 is arranged on the carrier 100, in particular on the opening 130. The paste 150 may be configured to keep the first and second segments 101, 102 in a defined position relative to each other in the case that the opening 130 completely separates the carrier 100 into first and second segments 101 and 102.

Applying the paste 150 to the carrier 100 may be a process step in a process of fabricating a semiconductor package comprising the carrier 100 and may be done prior to an encapsulation step. Applying the paste 150 to the carrier 100 may also be done prior to fabricating the opening 130. In this case, the paste 150 may be applied on the carrier 100 at the designated position of the opening 130. The paste 150 may be applied to the carrier 100 by any suitable means, for example by injection.

The paste 150 may partially or completely fill the opening 130 and may partially or completely cover an upper main face of the carrier 100, in particular in an area around the opening 130. The paste 150 may comprise any suitable dielectric material, for example a polymer like for example a silicone glue. The paste 150 may be optically transparent or nontransparent, for example an optically transparent silicone.

Figure 1E:
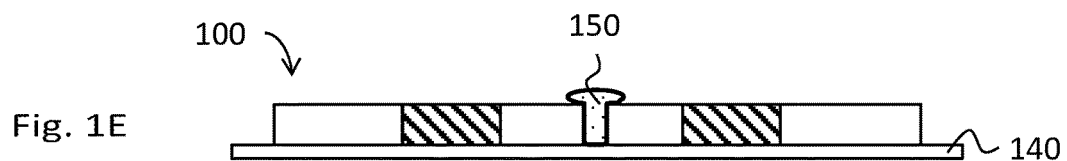

FIG. 1E shows another example according to the disclosure, wherein both the temporary carrier 140 and the paste 150 are used on the carrier 100. For example, the carrier 140 and the paste 150 may be used on the carrier 100 prior to fabricating the opening 130. According to an example, using both the temporary carrier 140 and the paste 150 may help to better keep the first and second segments 101, 102 in a defined position relative to each other. According to another example, the temporary carrier 140 is used to keep the first and second segments 101, 102 in position and the paste 150 (also) has another function, for example to act as an optically transparent cover in an optoelectronic semiconductor package like the optoelectronic semiconductor package 400 described further below.

Figure 1F:
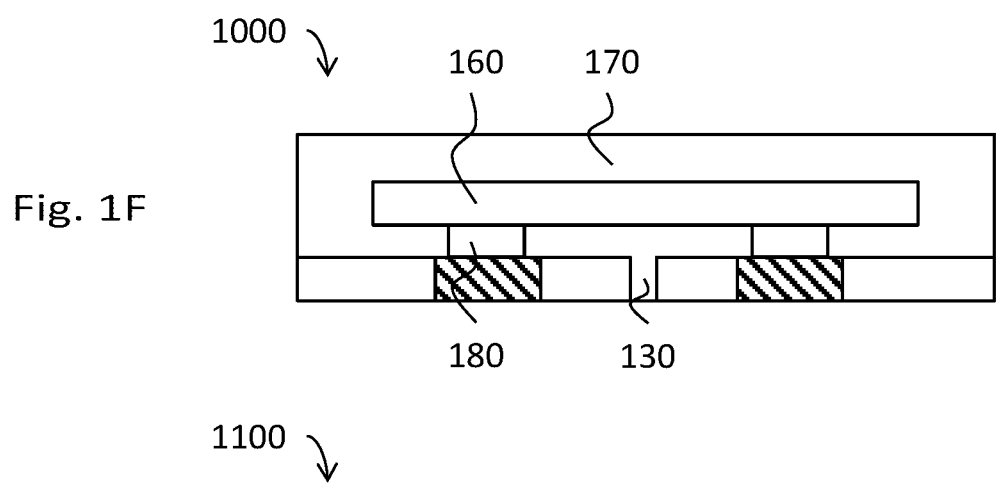

FIG. 1F shows a semiconductor package 1000 comprising the carrier 100 and the opening 130. The semiconductor package 1000 further comprises a semiconductor chip 160 and an encapsulation body 170 encapsulating the semiconductor chip 160. The semiconductor chip 160 is arranged above the carrier 100 and is electrically connected to it. The encapsulation body 170 may for example be fabricated via molding or via lamination.

The semiconductor chip 160 may comprise electrodes on its upper main face, or on its lower main face, or on both the upper and the lower main face. The semiconductor chip 160 may for example be electrically coupled to the carrier 100 by bonding wires or by connection element(s) 180 arranged on the upper main face of the carrier 100 as shown in FIG. 1F. The connection elements 180 may couple electrodes (not shown) of the semiconductor chip 160 to the second elements 120 of carrier 100. The connection elements 180 may comprise pillars comprising or consisting of a suitable metal, for example Cu.

The semiconductor package 1000 may comprise an underfill arranged between the semiconductor chip 160 and the carrier 100. Alternatively, the encapsulation body 170 may act as underfill.

According to an example, the encapsulation body 170 may extend into the opening 130 and may in particular completely fill the opening 130 as shown in FIG. 1F.

Figure 1G:
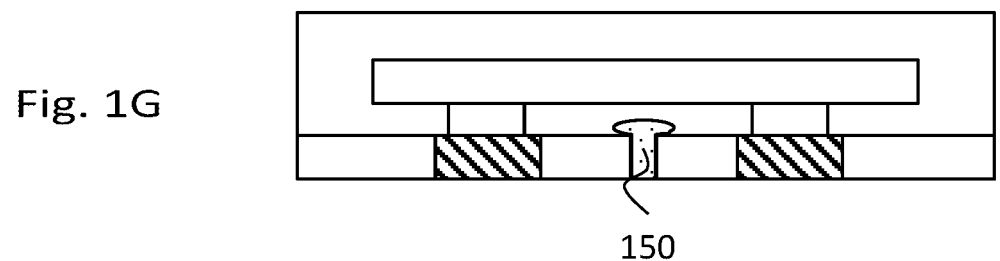

FIG. 1G shows another example of a semiconductor package 1100 comprising the carrier 100 with the opening 130. Semiconductor package 1100 is identical to semiconductor package 1000 except for the fact that paste 150 is arranged in the opening 130 of semiconductor package 1100. The encapsulation body 170 may be arranged between the lower main face of the semiconductor chip 160 and the paste 150 as shown in FIG. 1G or the paste 150 may extend up to the lower main face of the semiconductor chip 160 and at least partially cover the lower main face of the semiconductor chip 160.

According to an example, an opening in a carrier like the opening 130 in carrier 100 may act as a stress release feature. For example, stress may be induced in a semiconductor package by a difference in the CTE of the carrier and the CTE of another component of the semiconductor package, like a semiconductor chip. For example, the CTE of the carrier may be greater than the CTE of the semiconductor chip which in turn may lead to an unwanted warpage of the carrier when the semiconductor package is heated up or cooled down.

The semiconductor packages 1000, 1100 may comprise outer contacts (not shown) and may be surface mount technology packages, for example flat no-leads packages, in particular quad flat no-leads packages, or leaded packages, or through hole technology packages. In particular, the outer contacts may be comprised in the carrier 100. The semiconductor packages 1000, 1100 may be molded interconnect devices (MIDs).

Figure 2A:
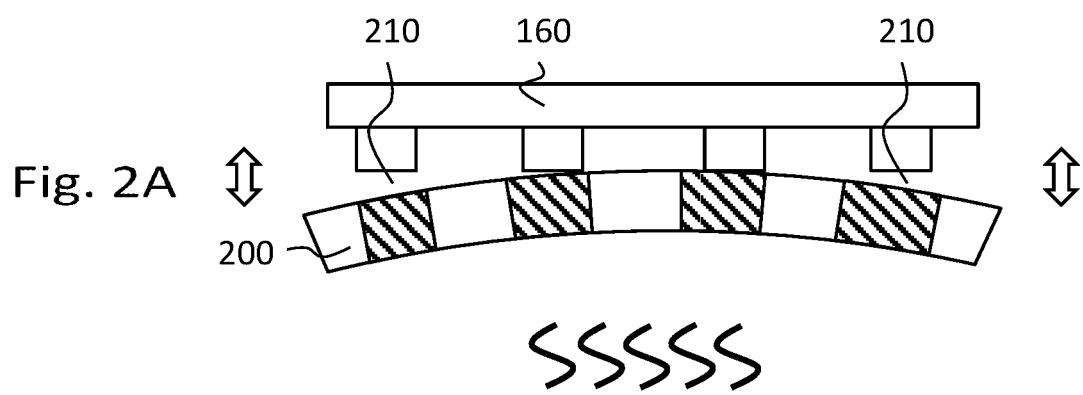
FIGS. 2A and 2B are schematic side views showing how a carrier without a stress relief feature (FIG. 2A) and with a stress relief feature (FIG. 2B) may react to stress.

FIG. 2A shows an example of an unwanted warpage of a carrier 200 due to thermal expansion of the carrier 200. The warpage may lead to a failure of (solder) joints 210 coupling semiconductor chip 160 to the carrier 200.

Figure 2B:
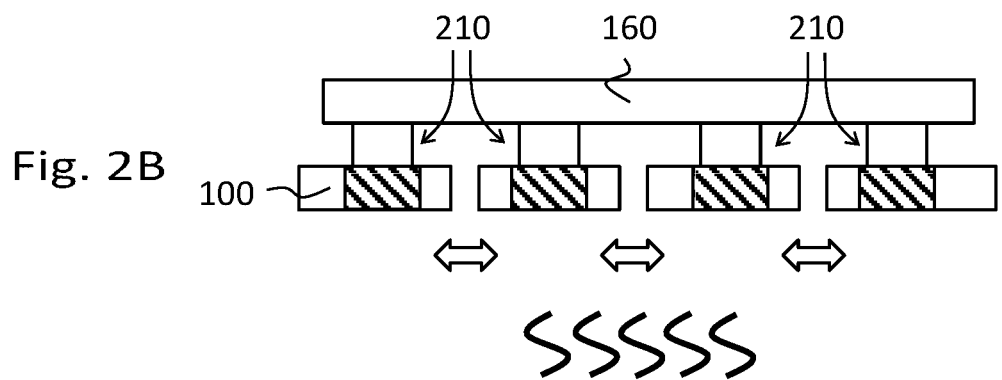

FIG. 2B shows an assembly of a carrier 100 comprising openings 130 and a semiconductor chip 160 being subjected to heat (indicated by the sinusoidal lines below the carrier 100). Due to the openings 130 acting as stress relief feature the carrier 100 can expand/shrink as indicated by the arrows without breaking off the joints 210 coupling the semiconductor chip 160 to the carrier 100.

According to another example, an opening in a carrier like the opening 130 in carrier 100 may (also) function as a passage for light passing into or out of an optoelectronic semiconductor package.

In the following FIGS. 3A-3C examples of carriers 300A, 300B and 300C comprising openings 130 are shown, wherein the carriers 300A, 300B and 300C may correspond to the carrier 100.

Figure 3A:
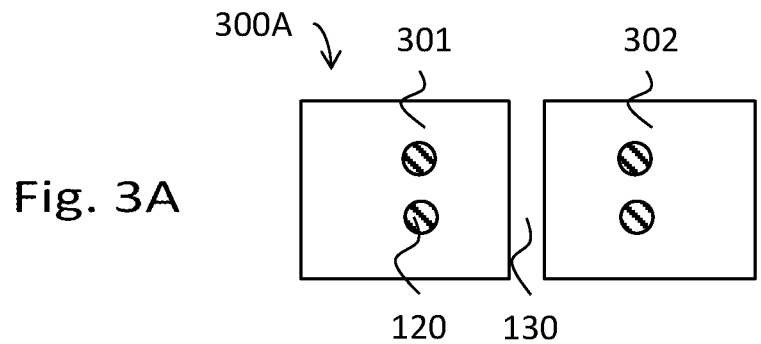
FIGS. 3A-3C are schematic top views of different examples of carriers comprising an opening according to the disclosure.

FIG. 3A shows a carrier 300A comprising an opening 130 in the form of a trench, wherein the trench completely separates the carrier 300A into a first segment 301 and a second segment 302.

Figure 3B:
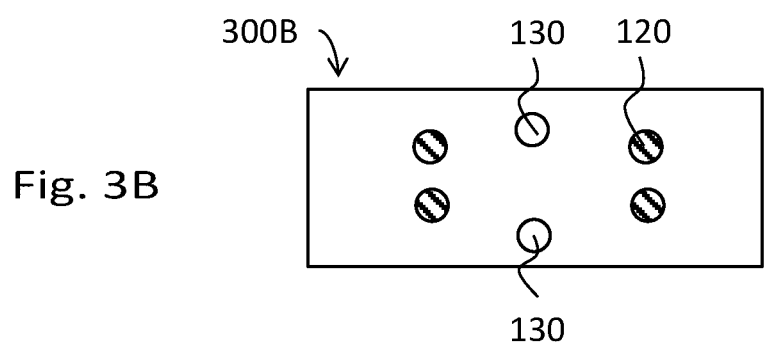

FIG. 3B shows a carrier 300B comprising openings 130 in the form of holes.

Figure 3C:
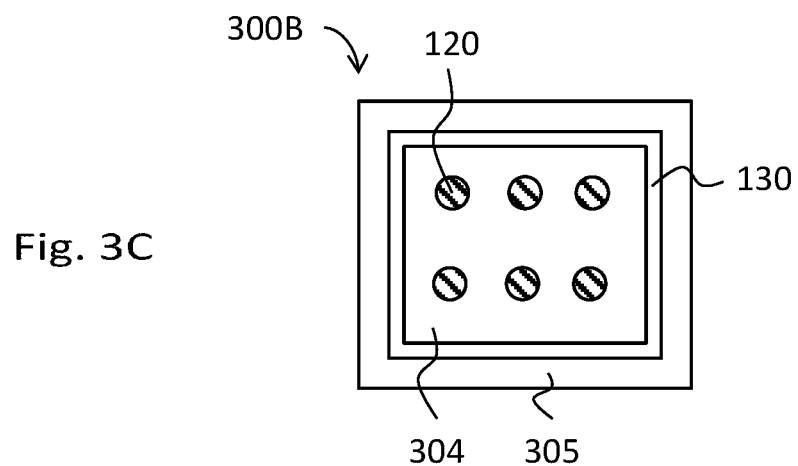

FIG. 3C shows a carrier 300C comprising an opening 130 in the form of a rectangular trench separating the carrier 300C into an inner segment 304 and an outer segment 305.

The openings may not only have the exemplary shapes and positions shown in FIGS. 3A-3C, but they may have any suitable shape and may be positioned on the carrier in any suitable way. For example, the openings 130 may be arranged on the carriers 100, 300A, 300B, 300C below an outline of a semiconductor chip or they may be arranged laterally displaced from an outline of a semiconductor chip.

Second elements 120 may be arranged on all segments of the carriers 300A and 300C, that is on the first segment 301, second segment 302, inner segment 304 and outer segment 305. Alternatively, second elements 120 may be arranged only on some of the segments of the carriers 300A and 300C, for example only on the first segment 301, but not on the second segment 302 or only on the inner segment 304, but not on the outer segment 305.

Figure 4:
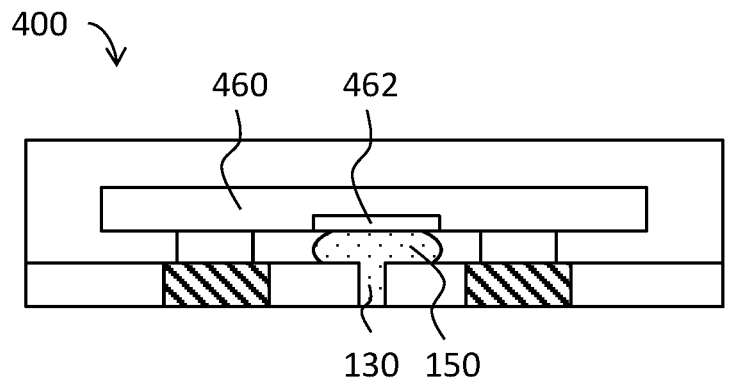
FIG. 4 is a schematic side view of an optoelectronic semiconductor package comprising a carrier with an opening according to the disclosure.

FIG. 4 shows an example of a semiconductor package 400, wherein the semiconductor package 400 may correspond to the semiconductor package 1100 of FIG. 1G. The semiconductor package 400 is an optoelectronic semiconductor package comprising a semiconductor chip 460 with a photo active area 462 and an opening 130 opposite the photo active area 462. An optically transparent paste 150 is arranged in the opening 130 and at least partially covers the photo active area 462. The term "optically transparent" may specify that the paste 150 is transparent in a suitable (electromagnetic) spectrum, for example in one or more of the infrared spectrum, the visible spectrum or the UV spectrum. The photo active area 462 may comprise a photo sensitive area (a sensing area) or a photo emitter (e.g. a diode). The semiconductor package 400 may comprise more than one photo active area 462 which may be of the same type or of different types (for example a sensing area and a photo emitter) and it may comprise more than one opening 130, for example one or more openings 130 per photo active area 462.

The opening 130 and the paste 150 may be configured to let light pass from the photo active area 462 to the outside or from the outside to the photo active area 462. Therefore, the optoelectronic semiconductor package 400 may be used to communicate with another device optically without the need for an electrical contact.

Figure 5:
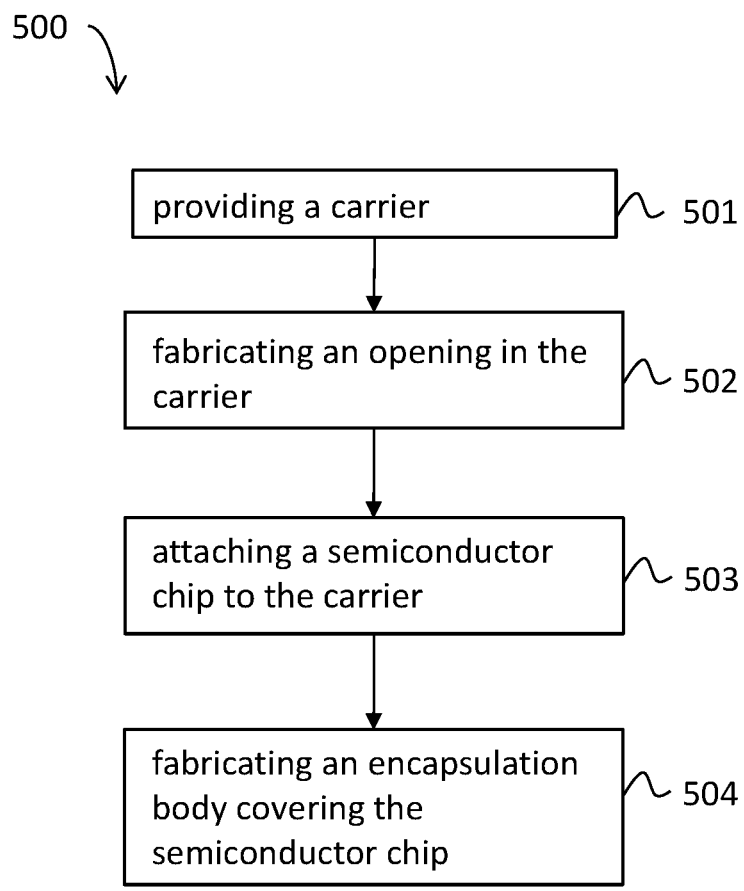
FIG. 5 is a flow chart of an example of a method for fabricating a semiconductor package according to the disclosure.

FIG. 5 shows a flow chart of an example of a method 500 for fabricating a semiconductor package comprising an opening like the semiconductor packages 1000, 1100 and 400. The method comprises a first method step 501 of providing a carrier, a second method step 502 of fabricating an opening in the carrier, for example using a laser for cutting or drilling through the carrier, a third method step 503 of attaching a semiconductor chip to the carrier and a fourth method step 504 of fabricating an encapsulation body covering the semiconductor chip. According to an example, the method steps 501 to 504 are performed in the above mentioned order.

The method 500 may be performed in a parallel manner such that a multitude of semiconductor packages is fabricated in parallel according to the method steps of method 500. For example, the method 500 may be carried out while the carrier is still part of a carrier assemblage like for example a leadframe stripe. Alternatively, the method 500 may be performed in a sequential manner such that individual semiconductor packages are fabricated sequentially one after the other. Furthermore, some method steps may be performed in a parallel manner while other method steps may be performed in a sequential manner.

The method 500 may comprise an additional method step which comprises one or more of attaching the carrier to a temporary carrier and applying a paste to the carrier. The additional method step may be carried out before method step 502 or after method step 502. In other words, the carrier may be attached to the temporary carrier before the opening is fabricated or the opening may be fabricated and the carrier comprising the opening may be attached to the temporary carrier. Likewise, the paste may be applied to the carrier and afterwards the opening is fabricated below the paste such that the paste covers the opening and may pour into the opening, or the opening is fabricated and afterwards the paste is applied onto the opening.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:

1. A method of fabricating a semiconductor package, the method comprising:
   providing a carrier;
   fabricating an opening in the carrier;
   attaching a semiconductor chip to the carrier; and
   fabricating an encapsulation body covering the semiconductor chip;
   applying a paste onto the carrier prior to fabricating the opening and prior to fabricating the encapsulation body, wherein the paste is applied at a designated position of the opening.

2. The method of claim 1, wherein the opening is configured to relieve the semiconductor package from stress.

3. The method of claim 2, wherein the stress is based on a difference between the coefficients of thermal expansion of the carrier and the semiconductor chip.

4. The method of claim 1, wherein the fabricating of the opening in the carrier comprises at least one of cutting and drilling through the carrier.

5. The method of claim 4, wherein the at least one of cutting and drilling is performed using a laser.

6. The method of one claim 1, further comprising:
   attaching the carrier to a temporary carrier prior to fabricating the opening.

7. The method of claim 1, wherein the opening comprises a hole or a trench.

8. The method of claim 1, wherein the opening comprises a trench that separates the carrier into a first segment and a second segment.

9. The method of claim 8, further comprising:
   attaching the carrier to a temporary carrier prior to fabricating the trench, wherein the temporary carrier is configured to keep the first segment and the second segment in a defined position relative to each other.

10. The method of claim 8, further comprising:
    applying the paste onto the carrier prior to fabricating the trench, the paste being configured to keep the first and second segments in a defined position relative to each other.

11. The method of claim 1, wherein the semiconductor chip comprises a photo active area and wherein the opening is configured to let light pass between the photo active area and the outside of the semiconductor package.

* * * * *